United States Patent [19]

Ho

[11] 4,263,559
[45] Apr. 21, 1981

[54] N-WAY SERIES CONNECTED QUADRATURE POWER DIVIDER AND COMBINER

[75] Inventor: Pang T. Ho, Mountain View, Calif.

[73] Assignee: Ford Aerospace & Communications Corp., Detroit, Mich.

[21] Appl. No.: 6,816

[22] Filed: Jan. 26, 1979

[51] Int. Cl.³ .............................................. H03F 3/60
[52] U.S. Cl. ............................ 330/53; 330/124 R; 330/286; 333/116
[58] Field of Search .................... 330/53, 124 R, 286, 330/287; 333/109, 112, 113, 115, 116

[56] References Cited

U.S. PATENT DOCUMENTS

| | | | |
|---|---|---|---|
| 3,516,024 | 6/1970 | Lange | 333/116 |
| 3,593,174 | 7/1971 | White | 330/53 |
| 3,883,827 | 5/1975 | Seidel | 333/112 |
| 3,928,806 | 12/1975 | Carter et al. | 333/1.1 X |
| 3,963,993 | 6/1976 | Hoffman et al. | 330/124 R |
| 4,064,464 | 12/1977 | Morse | 330/53 |

OTHER PUBLICATIONS

Morse, *Modify Combiner Designs To Team High Power Amps*, Microwaves, Jan. 1978, pp. 70-74.

*Primary Examiner*—Paul L. Gensler
*Attorney, Agent, or Firm*—Edward J. Radlo; Clifford L. Sadler

[57] ABSTRACT

This circuit divides power from an input source equally among N different paths, where N is an arbitrary number. These individual path powers can then be amplified separately to take advantage of the full output power ratings for the individual amplifiers, then the outputs from the amplifiers are combined. A combiner circuit, which is the reverse of the divider circuit, then combines the individual powers to a single output. In each of the combiner and divider circuits, the phase angles of the output ports vary from each other by 90 degrees sequentially down the entire chain of N−1 couplers. Each combiner and divider network utilizes N−1 series-connected couplers, preferably interdigitated ones. The interdigitated couplers utilize preselected power division ratios based upon N.

8 Claims, 2 Drawing Figures

4,263,559

N-WAY SERIES CONNECTED QUADRATURE POWER DIVIDER AND COMBINER

BACKGROUND OF THE INVENTION

1. Field of the Invention

This invention relates to a method and apparatus for dividing and combining power equally among N paths, utilizing interdigitated or other couplers. Such a network has applicability in, for example, microwave transmitters utilizing solid state amplifiers, where it is desired to increase the output power of said transmitters by combining an arbitrary number N of amplifiers.

2. Description of the Prior Art

Prior art systems which divided power N ways did not provide the advantages of the current system, which include:

a system which is widebanded, i.e., can operate over more than an octave bandwidth at microwave frequencies;

a system in which each output port's phase differs from the preceding port's phase by 90 degrees (quadrature configuration);

excellent isolation between elements of the combiner or divider.

What is needed, therefore, is a wideband power divider and power combiner circuit with good isolation between output ports and 90 degree phase differentiation between successive ports which uses interdigitated couplers with arbitrary power division ratios. These requirements are met by the present invention.

OBJECTS OF THE INVENTION

It is therefore a primary object of the present invention to provide an improved power divider and combiner utilizing cascaded interdigitated couplers.

It is a further object of the present invention to provide for a power divider and combiner utilizing interdigitated couplers with arbitrary power division ratios.

It is a further object of the present invention to provide for a power divider and combiner which is capable of operation over more than an octave bandwidth and has 90 degree phase differentiation between successive output ports.

BRIEF DESCRIPTION OF THE DRAWINGS

These and other and more detailed and specific objects and features of the present invention are more fully disclosed in the following specification, reference being made to the accompanying drawings in which.

SUMMARY OF THE INVENTION

The present invention operates on the principle that to maximize performance from each of a set of N power amplifiers, it is desirable to arbitrarily be able to divide an incoming power line into N paths each of which has P/N power travelling therethrough. This is particularly true where the amplifiers are solid state, because they they have limited heat dissipation capability and power output capability. Each individual amplifier then amplifies the signal on each path to its full capability. The outputs from each of these amplifiers are then combined, so a circuit is needed to combine N equally powerful paths into a single output line while minimizing the insertion loss thereby.

The power divider network utilizes a cascaded network of series-connected interdigitated couplers with preselected power division factors. The output from each individual coupler of this network is 90 degrees out-of-phase from the preceding coupler in the chain. After the individual paths have been amplified, the power combination network, which is the reverse of the power division network and which also utilizes a cascaded series of interdigitated couplers, restores the original polarity to each of the paths so that they are all in phase when they reach the output power line.

To select the proper values for the digit width and digit spacing of the individual interdigitated couplers so as to obtain the desired preselected power division ratio, one solves a set of equations after substituting known values of system impedance, number of complete digits, and power division ratio (power in couple port divided by power in input port).

When a three-way power dividing and combining circuit was constructed utilizing the principles of the present invention, it was found that the minimum inband isolated between the three output ports was more than 25 dB. This excellent port-to-port isolation eliminated the interaction between amplifiers during power combination.

When N amplifiers are employed with an N-way power divider and an N-way power combiner, the combined amplifier delivers N times the output power as a single amplifier having the same characteristics.

N is arbitrary and any number of amplifiers can be combined in such a way utilizing the present invention.

OPERATION OF THE PREFERRED EMBODIMENT

Figure 1:
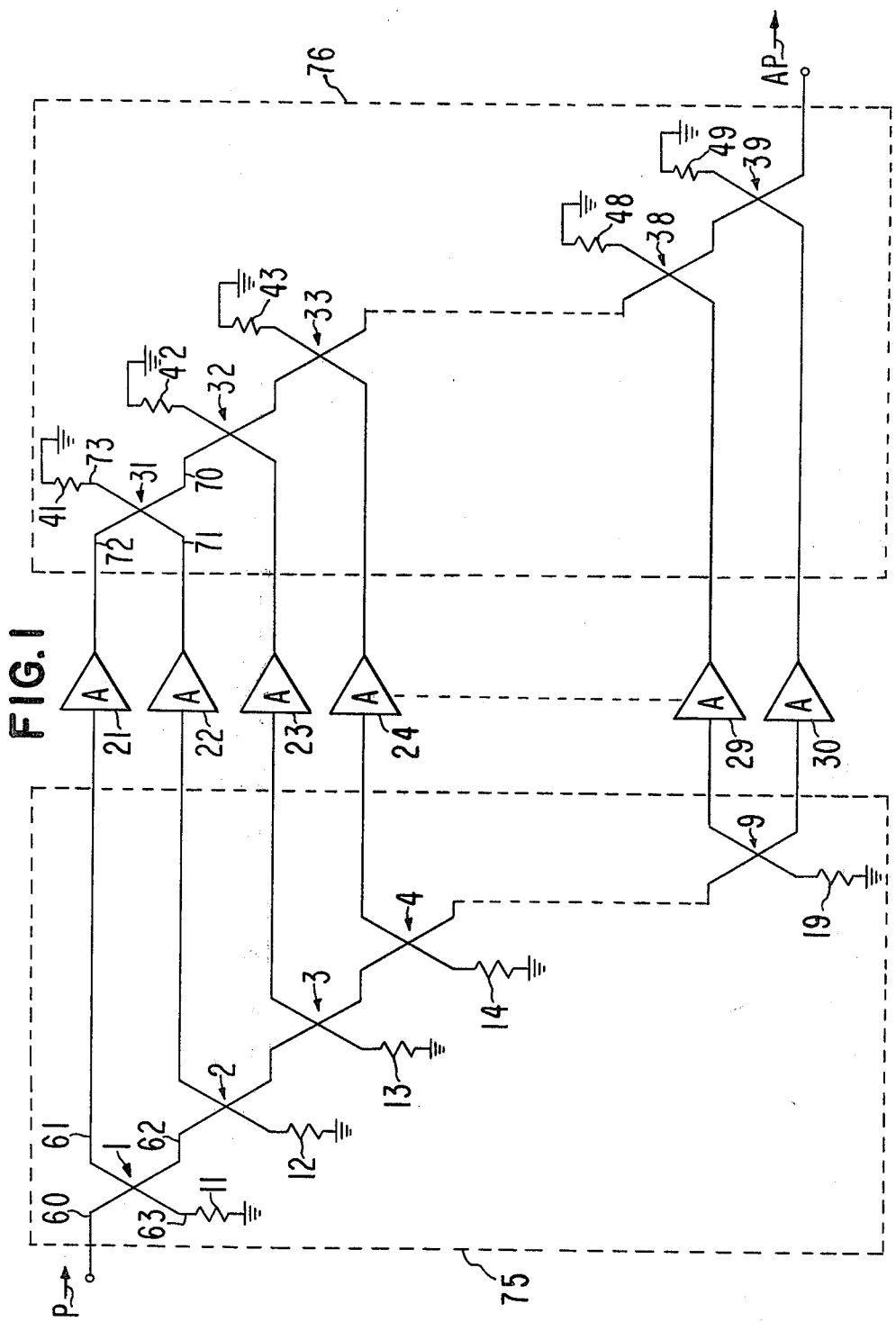
FIG. 1 is a schematic diagram showing the N-way power divider and the N-way power combiner of the present invention connected to a set of N amplifiers.

Turning to FIG. 1, we see a circuit comprising N amplifiers. For ease of illustration, we have arbitrarily selected N to be 10; however, it must be understood that N can be any number. The amplifiers are labeled 21 through 30, respectively. Each amplifier has a same amplification factor, A.

The major components of the power divider (labeled 75) are couplers 1, 2, 3 . . . 9. There are N−1 couplers in the input power divider network. Associated with each of these couplers is a resistor. They are labeled 11, 12, 13 . . . 19, respectively. Each resistor is preferably 50 ohms to set a standard impedance for the system coincident with the typical impedance of 50 ohms which is used in standard transmission systems, although another value of impedance could be chosen.

The power combining network (labeled 76) consists primarily of couplers 31, 32, 33 . . . 39. There are always N−1 couplers in the output network. Associated with each coupler in said network is a resistor. These are labeled 41, 42, 43 . . . 49. Again, there are N−1 resistors. Each one is typically 50 ohms to keep the circuit functioning at the standard 50 ohm impedance level. In each case, for both the divider and combiner network, the resistor associated with each coupler is connected between the isolation port of said coupler and ground.

In the preferred embodiment, the couplers are of the interdigitated type; however, branch-line or proximity couplers could be used.

In operation P is the input power into the system. It is desired to amplify P by the factor A. The number N is chosen based upon the limitations of the individual amplifiers, because each amplifier is assumed to be able to handle only AP/N amount of power. For coupler 1, the input port is labeled 60, the couple port is labeled 61, the through port is labeled 62, and the isolate port is labeled 63. It is desired that 1/N times the P input power exits the couple port of coupler 1. Therefore, coupler 1 must be constructed with these power division characteristics. The amount of power left exiting through port 62 of coupler 1 and entering the input port of coupler 2 is (N−1)P/N, in this case 9/10th P. It is desired that 1/(N−1) of this power, in this case 1/9th of this power, exit the couple port of coupler 2 and so this coupler must be built with these characteristics.

Thus, (N−2)/N (or in this case 8/10ths) P of power exits the through port of coupler 2 and enters the input port of coupler 3. It is desired that 1/(N−2) or in this case ⅛th of this power exit through the couple port of coupler 3.

Proceeding in this fashion, one finally enters the input port of the last coupler, coupler 9. In this case, one-half of the remaining power (2P/N) exits the couple port of this final coupler and the other one-half of the remaining power exits the through port of this final coupler. Each port feeds an amplifier, amplifiers N−1 and N, respectively, in this case amplifiers 29 and 30.

Thus it is seen that P/N amount of power feeds each of the N amplifiers.

At this point, when interdigitated couplers are employed, the phase angles of the outputs from these couplers (which become the inputs to each of the N amplifiers) are 90 degrees out of phase from the output from the preceding coupler. Each amplifier amplifies its path with amplification factor A, thus the outputs from the amplifiers are still 90 degrees successively out of phase. The output power from each path is AP/N, in this case AP/10. Then the combiner network comes into play. The combiner circuit is the reverse of the divider circuit. By this is meant that for coupler 31, through port 72 is connected to the output of amplifier 21. Resistor 41 is connected between isolate port 73 of coupler 31 and ground. Couple port 71 of coupler 31 is connected to the output of amplifier 22 and input port 70 of coupler 31 is connected to the through port of the adjacent series-connected coupler 32. The power combination ratio (which is the same as the power division ratio when the ports are defined this way) of coupler 31 is pre-established at one-half. Thus the amount of power entering the through port of coupler 32 from the input port of coupler 31 is 2AP/N, in this case AP/5. For coupler 32, its through port is connected to the input port of the previous coupler, coupler 31. The couple port of coupler 32 is connected to the output of amplifier 23. Resistor 42 is connected between the isolate port of coupler 32 and ground, and the input port of coupler 32 is connected to the through port of coupler 33. The power division characteristics of coupler 32 are pre-established at ⅓, thus the amount of power exiting the input port of coupler 32 into the through port of coupler 33 is 3AP/N, in this case 3AP/10.

Proceeding in this fashion we come to coupler 38. Its division characteristics are set at 1/(N−1), in this case 1/9. Thus, the amount of power exiting the input port of coupler 38 into the through port of coupler 39 is (N−1)/N times AP, in this case 9/10th AP. Finally, the power division characteristic of coupler 39 is set at 1/N, in this case 1/10. It is seen that the through port of coupler 39 is connected to the input port of coupler 38, the couple port of coupler 39 is connected to the output of amplifier 30, the input port of coupler 39 is connected to the output trunk line and resistor 49 is connected between the isolate port of coupler 39 and ground. It is thus seen that the final output power flowing into the output trunk line is AP.

Figure 2:
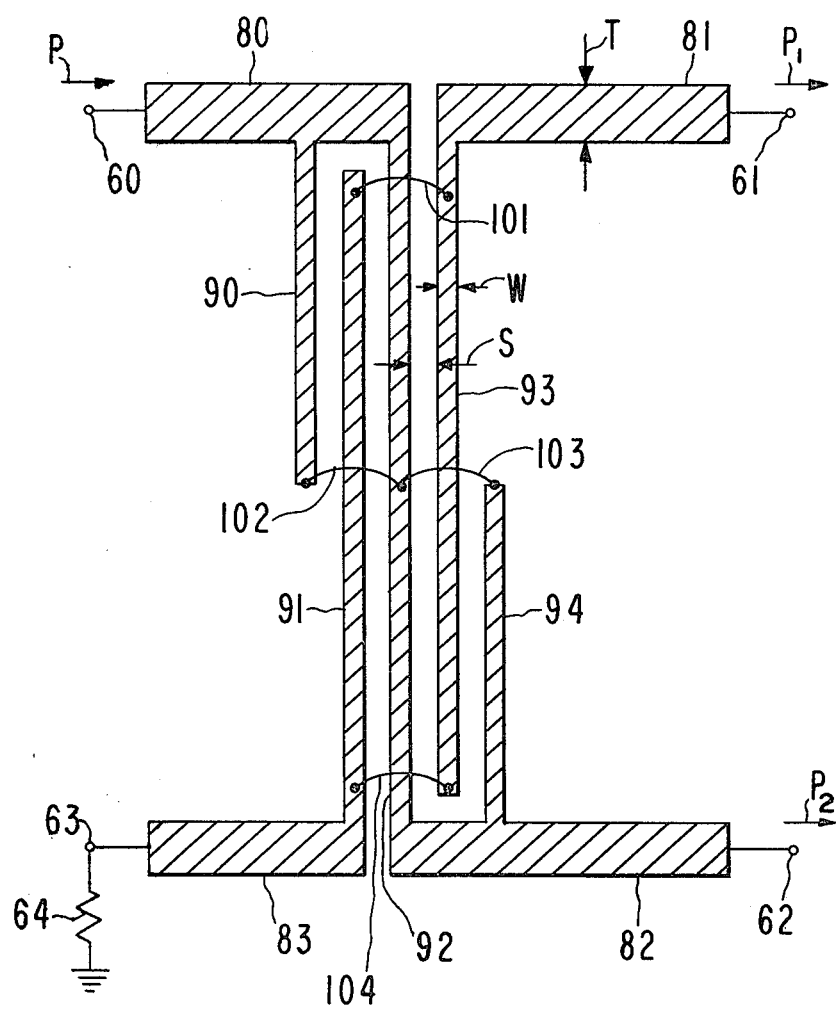
FIG. 2 is a schematic diagram showing the construction of an interdigitated coupler utilized in the present invention, which coupler has an arbitrary power division ratio.

Turning to FIG. 2, we see a diagram of an interdigitated coupler whose power division characteristics can be arbitrarily preselected. The shaded lines in FIG. 2 represent microstrip, which is a highly conductive piece of conductor, typically copper or gold. This microstrip resides on a dielectric substrate with a metal backup plate typically comprising either copper or gold, which can serve as the ground for the system.

Consistent with the numbering which was given to coupler 1 of FIG. 1, 60 is the input port of the interdigitated coupler of FIG. 2, 61 is the couple port, 62 is the through port, 63 is the isolate port. 64 is the resistor which is set at the characteristic impedance of the system (normally 50 ohms for a typical transmission system). This resistor is connected between the isolate port of the coupler and ground. 80, 81, 82 and 83 are transmission lines which are connected to the four ports and to certain digits. Their width T must be selected with care so that the transmission lines will operate at the characteristic impedance of the system. The narrow bands of microstrip labeled 90, 91, 92, 93 and 94 are the interdigitated digits (fingers) of the coupler. The number of digits K is equal to the total number of complete fingers. In this case, K is four because there are three complete fingers and two demifingers. The interdigitated coupler can be comprised of a varying and arbitrary number of fingers. The geometry of the system in the case where K is four is typically that as shown by FIG. 2. It is important to connect fingers 91 and 93 with jumper wire 101 at the upper portion thereof and jumper wire 104 at the lower portion thereof so that these fingers operate at the same potential. It is also essential to connect fingers 90, 92 and 94 by means of jumper wires 102 and 103 as shown in FIG. 2 to equalize the potential of these fingers.

The critical parameters in designing the coupler are S, which is the spacing between fingers, and W, which is the width of each finger. For use in the present system of the invention it is desired to be able to construct an interdigitated coupler with an arbitrary power division ratio of 1/M. In this case the power $P_1$ leaving the couple port 61 of the coupler will be equal to P/M where P is the input power entering input port 60 of the coupler. It will also be true that the power $P_2$ leaving the through port 62 of the coupler will be equal to $(1-1/M)$ times P or $(M-1)/M$ times P. We know the value of M, the value of K from the number of complete fingers, and the value $Z_o$, which is the characteristic impedance of the system. Therefore, we know the value of $Y_o$ $(1/Z_o)$, the characteristic admittance of the system. We use these known quantities to solve for the unknown quantities $Y_{oo}$ and $Y_{oe}$ by using the following two equations:

$$Y_o^2 = \frac{[(K-1)Y_{oo}^2 + Y_{oo}Y_{oe}] \cdot [(K-1)Y_{oe}^2 + Y_{oo}Y_{oe}]}{(Y_{oo} + Y_{oe})^2}$$

-continued $$\frac{1}{M} = \left[ \frac{(K-1)Y_{oo}^2 - (K-1)Y_{oe}^2}{(K-1)Y_{oo}^2 + 2Y_{oo}Y_{oe} + (K-1)Y_{oe}^2} \right]^2$$

where $Y_{oe}$ is the even mode admittance of the coupled microstrip line and $Y_{oo}$ is the odd mode admittance of the coupled microstrip line. "Design Equations for an Interdigitated Directional Coupler," by Wen Pin Ou, IEEE Transactions on Microwave Theory and Techniques, February 1975, P. 253 et seq.

The microstrip transmission line is in an inhomogeneous medium that consists of the dielectric substrate and the air above. In order to realize the physical dimensions (S and W) of the coupled microstrip line from values of $Y_{oo}$ and $Y_{oe}$, the problem was treated in a rigorous manner through the use of a "dielectric Green's function" which expresses the discontinuity of the field at the dielectric-air interface. A computer program was used to solve the dielectric Green's function and obtain the values for S and W. See Bryant and Weiss, "Parameters of Microstrip Transmission Lines and of Coupled Pairs of Microstrip Lines," IEEE Transactions on Microwave Theory and Techniques, Vol. MTT-16, No. 12, December 1968, p. 1021 et seq.

This completes the description of the design considerations for fabrication of an interdigitated coupler with arbitrary power division characteristics.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What I claim as my invention is:

1. A power coupler microstrip circuit operable at microwave frequencies for providing an equal power distribution among an arbitrary number N paths comprising:
   N−1 series-connected quadrature directional couplers wherein the power division ratio of each Jth coupler is $1/(N-J+1)$;
   where J is an integer having a value of $1 \leq J \leq N-1$.

2. The circuit of claim 1 wherein the couplers are of the interdigitated type.

3. The circuit of claim 2 wherein the voltage phase angles at the output ports of adjacent couplers differ by 90 degrees.

4. The circuit of claim 1 wherein the through port of each Jth coupler is connected to the input port of the (J+1)st coupler.

5. A microstrip circuit for power combining an arbitrary number N amplifiers each having a power amplification factor of A comprising:
   a power dividing microstrip network having N−1 series-connected dividing quadrature directional couplers, the couple port of each dividing coupler being connected to the input of the first N−1 amplifiers, respectively, and the through port of the (N−1)st dividing coupler being connected to the input of the Nth amplifier; and
   a power combining microstrip network having N−1 series-connected combining quadrature directional couplers, the couple port of each combining coupler being connected to the output of the last N−1 amplifiers, respectively, and the through port of the first coupler being connected to the output of the first amplifier; wherein
   there are no intervening resistive components connected between said amplifiers and said power dividing network or said power combining network.

6. The circuit of claim 5 wherein the through port of each Jth dividing coupler is connected to the input port of the (J+1)st dividing coupler; and
   the input port of each Kth combining coupler is connected to the through port of the (K+1)st combining coupler, if any;
   where J and K are integers having values $1 \leq J \leq N-1$ and $1 \leq (K) \leq N-1$.

7. The circuit of claim 5 wherein the power division ratio of each Jth dividing coupler is $1/(N-J+1)$; and
   the power combination ratio of each Kth combining coupler is $1/(K+1)$.

8. A power combining microstrip circuit operable at microwave frequencies for providing an equal power combination of an arbitrary number N input paths comprising N−1 series-connected quadrature directional couplers wherein the power combination ratio of each Kth coupler is $1/(K+1)$;
   where K is an integer having a value $1 \leq K \leq N-1$.

* * * * *